United States Patent
Kobayashi

(10) Patent No.: US 7,618,875 B2
(45) Date of Patent: Nov. 17, 2009

(54) MARKING METHOD FOR PRODUCT INFORMATION

(75) Inventor: Yoshikazu Kobayashi, Ota-ku (JP)

(73) Assignee: Disco Corporation, Tokyo (JP)

( * ) Notice: Subject to any disclaimer, the term of this patent is extended or adjusted under 35 U.S.C. 154(b) by 38 days.

(21) Appl. No.: 12/008,730

(22) Filed: Jan. 14, 2008

(65) Prior Publication Data

US 2008/0176376 A1 Jul. 24, 2008

(30) Foreign Application Priority Data

Jan. 23, 2007 (JP) ............................. 2007-012394

(51) Int. Cl.
*H01L 21/76* (2006.01)
(52) U.S. Cl. ............... 438/401; 438/106; 438/107; 438/462; 438/464; 257/E21.525; 257/E21.599
(58) Field of Classification Search .................. None
See application file for complete search history.

(56) References Cited

U.S. PATENT DOCUMENTS

2003/0017652 A1* 1/2003 Sakaki et al. ............... 438/123

2004/0113283 A1* 6/2004 Farnworth et al. .......... 257/782

FOREIGN PATENT DOCUMENTS

| JP | A 5-121573 | 5/1993 |
|----|------------|--------|
| JP | A 5-166949 | 7/1993 |

\* cited by examiner

*Primary Examiner*—N Drew Richards
*Assistant Examiner*—Kyoung Lee
(74) *Attorney, Agent, or Firm*—Greer, Burns & Crain, Ltd

(57) ABSTRACT

A product information marking method including a back side grinding step for grinding the back side of a wafer having a plurality of devices formed on the front side so as to be partitioned by a plurality of separation lines, thereby obtaining a desired thickness of the wafer. After performing the back side grinding step, a marking step for marking product information on the back side of each device by applying a laser beam to the back side of the wafer is performed before separating the devices from each other. Thus, the product information is marked on each device in the stage of the wafer.

2 Claims, 6 Drawing Sheets

MARKING METHOD FOR PRODUCT INFORMATION

BACKGROUND OF THE INVENTION

1. Field of the Invention

The present invention relates to a method of marking product information on the back side of devices constituting a wafer.

2. Description of the Related Art

A plurality of devices such as ICs and LSIs are formed on the front side of a wafer so as to be partitioned by a plurality of separation lines. The back side of the wafer is ground to obtain a predetermined thickness of the wafer. Whether or not each device is defective is tested by a prober, and as the test result each defective device is marked. Thereafter, dicing is performed by cutting the wafer along the separation lines to obtain the individual devices separated from each other. Further, product information such as function, product number, and lot number is marked on the back side of each nondefective device (see Japanese Patent Laid-open Nos. 5-121573 and 5-166949, for example). An assembly step subsequent to this marking step is managed according to the product information marked on each nondefective device. However, it is troublesome that the product information is marked on each of the individual devices after dicing the wafer, causing a reduction in productivity.

SUMMARY OF THE INVENTION

It is therefore an object of the present invention to provide a product information marking method which can increase the efficiency of marking of product information on the back side of each device, thereby improving the productivity.

In accordance with an aspect of the present invention, there is provided a product information marking method including a back side grinding step for grinding the back side of a wafer having a plurality of devices formed on the front side so as to be partitioned by a plurality of separation lines, thereby obtaining a desired thickness of the wafer; and a marking step for marking product information on the back side of each device by applying a laser beam to the back side of the wafer.

Preferably, the back side of the wafer is ground by a grinding stone containing abrasive grains having a grain size of 1 µm or less in the back side grinding step. Preferably, the product information marking method further includes a mirror finishing step to be performed before the marking step, wherein a strain layer is removed from the back side of the wafer by chemical mechanical polishing or dry polishing to thereby obtain a mirror surface on the back side of the wafer. Preferably, the product information marking method further includes a separation step to be performed after the marking step, wherein the devices formed on the front side of the wafer are separated from each other along the separation lines.

According to the present invention, the product information is marked on the back side of each device in the form or stage of the wafer before separating the plural devices from each other. Accordingly, the efficiency of marking can be improved to thereby improve the productivity as compared with the case that the marking step is performed after the separation step.

In the case that the mirror finishing step is performed before the marking step, the die strength of each device can be increased and the product information marked on each device can be seen easily. In the stage where the back side of the wafer has been mirror-finished, a gettering effect of copper ions or the like inside the wafer is reduced. However, by marking the product information on the back side of the wafer after the mirror finishing step, the gettering effect can be improved to thereby improve the quality of each device.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
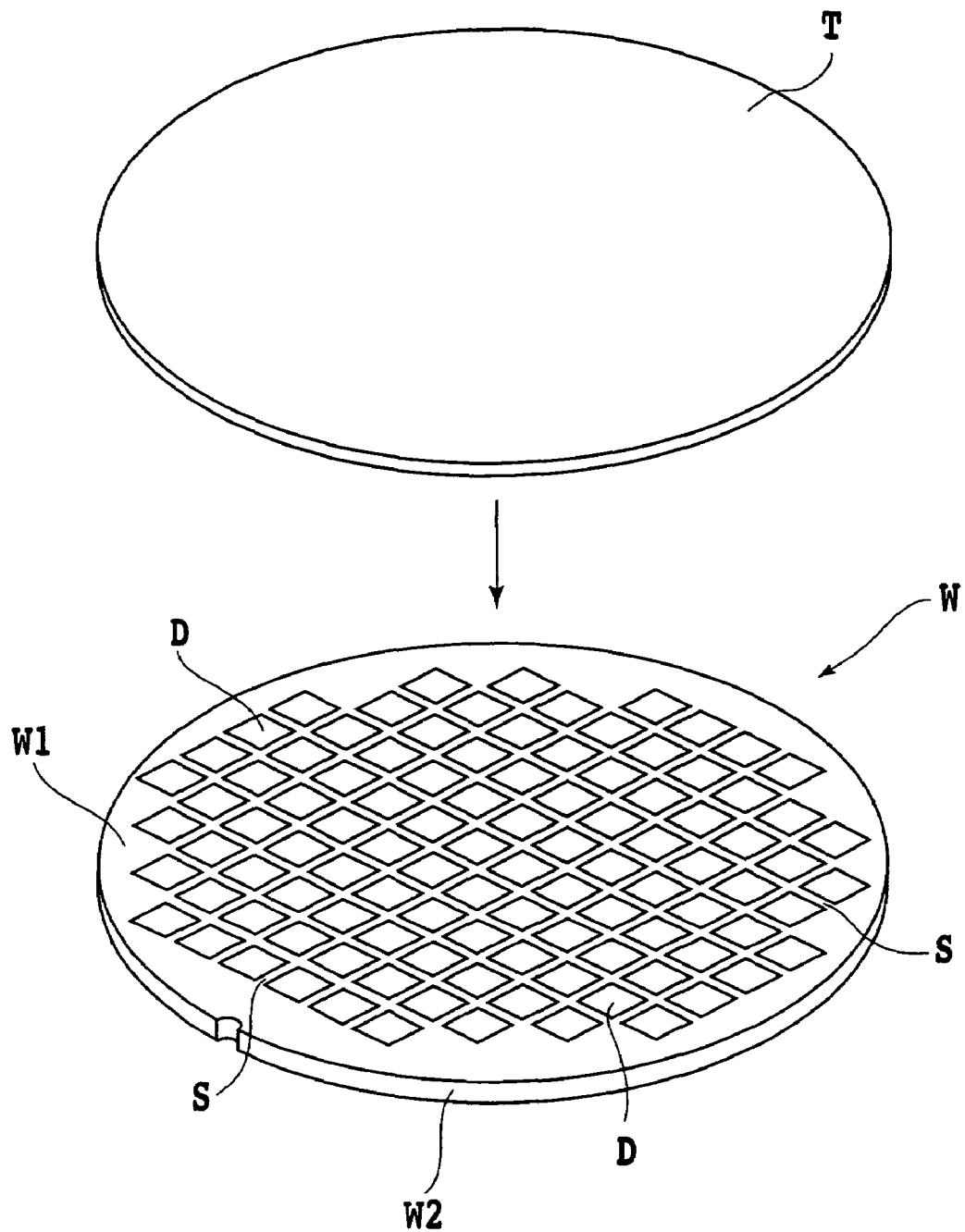
FIG. 1 is a perspective view of a wafer and a protective tape.

As shown in FIG. 1, a plurality of devices D are formed on the front side W1 of a wafer W so as to be partitioned by a plurality of separation lines S extending in the vertical and horizontal directions (X and Y directions). A protective tape T is attached to the front side W1 of the wafer W prior to grinding of the back side W2 of the wafer W. In grinding the back side W2 of the wafer W, the wafer W is held on a chuck table 10 of a grinding unit 1 shown in FIG. 2 in the condition where the protective tape T is placed on the under side of the wafer W and the back side W2 of the wafer W is exposed.

Figure 2:
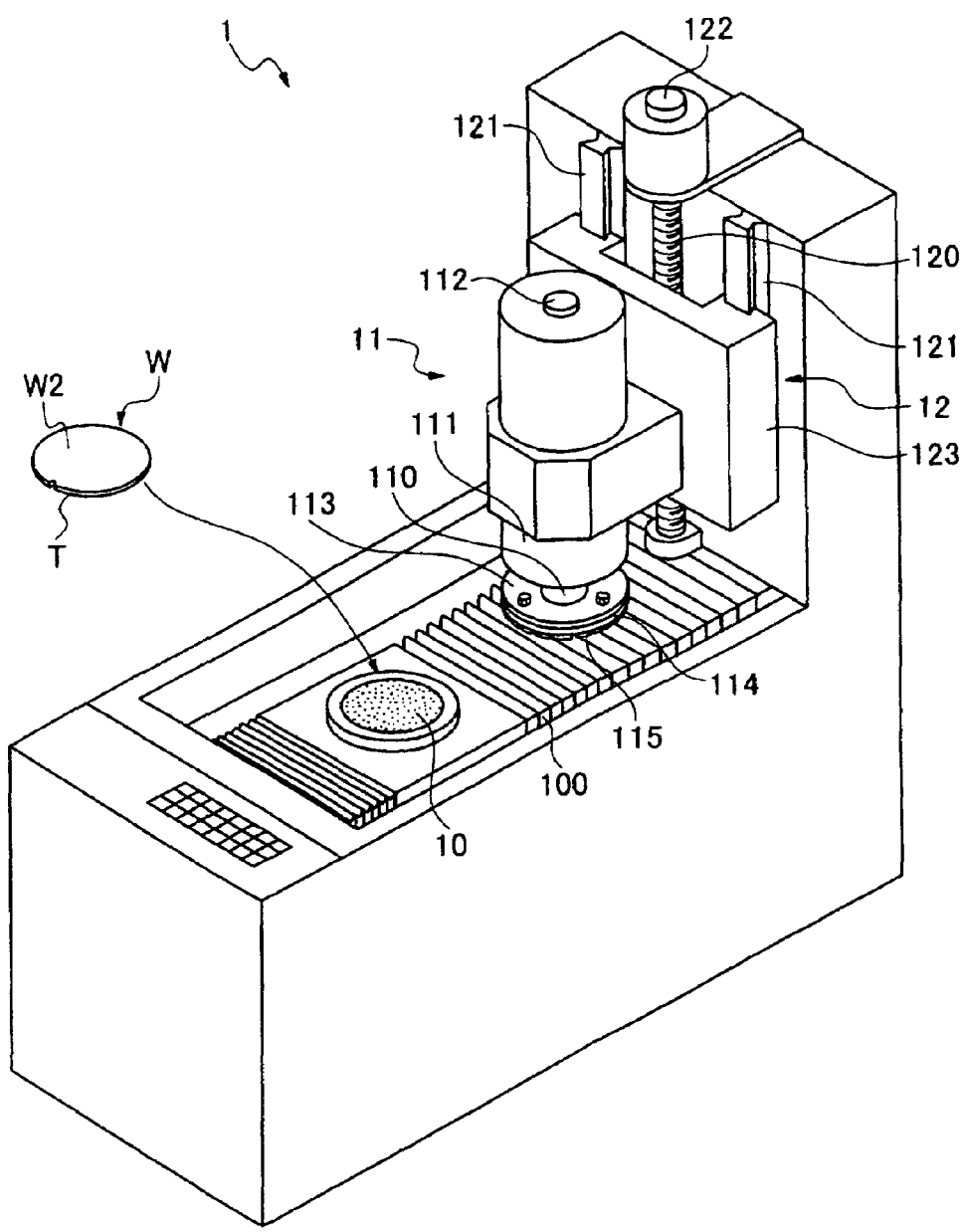
FIG. 2 is a perspective view of a grinding unit usable in the present invention.

The grinding unit 1 shown in FIG. 2 includes the chuck table 10 for holding the wafer W, grinding means 11 for grinding the wafer W held on the chuck table 10, and feeding means 12 for feeding the grinding means 11 in the vertical direction (Z direction). The chuck table 10 is rotatable and movable in the horizontal direction by the expansion and contraction of a bellows 100. The grinding means 11 includes a housing 111, a spindle 110 having a vertical axis and rotatably supported to the housing 111, a motor 112 connected to the upper end of the spindle 110, a wheel mount 113 formed at the lower end of the spindle 110, and a grinding wheel 114 mounted on the wheel mount 113. A grinding stone 115 is fixed to the lower surface of the grinding wheel 114. The grinding stone 115 is composed of abrasive grains having a grain size of 1 µm or less and a bonding agent for bonding the abrasive grains.

The feeding means 12 includes a-ball screw 120 extending in the vertical direction (Z direction), a pair of guide rails 121 extending parallel to the ball screw 120, a pulse motor 122 connected to the upper end of the ball screw 120, and a supporting portion 123 for supporting the housing 111. The supporting portion 123 has a threaded portion for threadedly engaging the ball screw 120 and a side portion for slidably engaging the guide rails 121.

Figure 3:
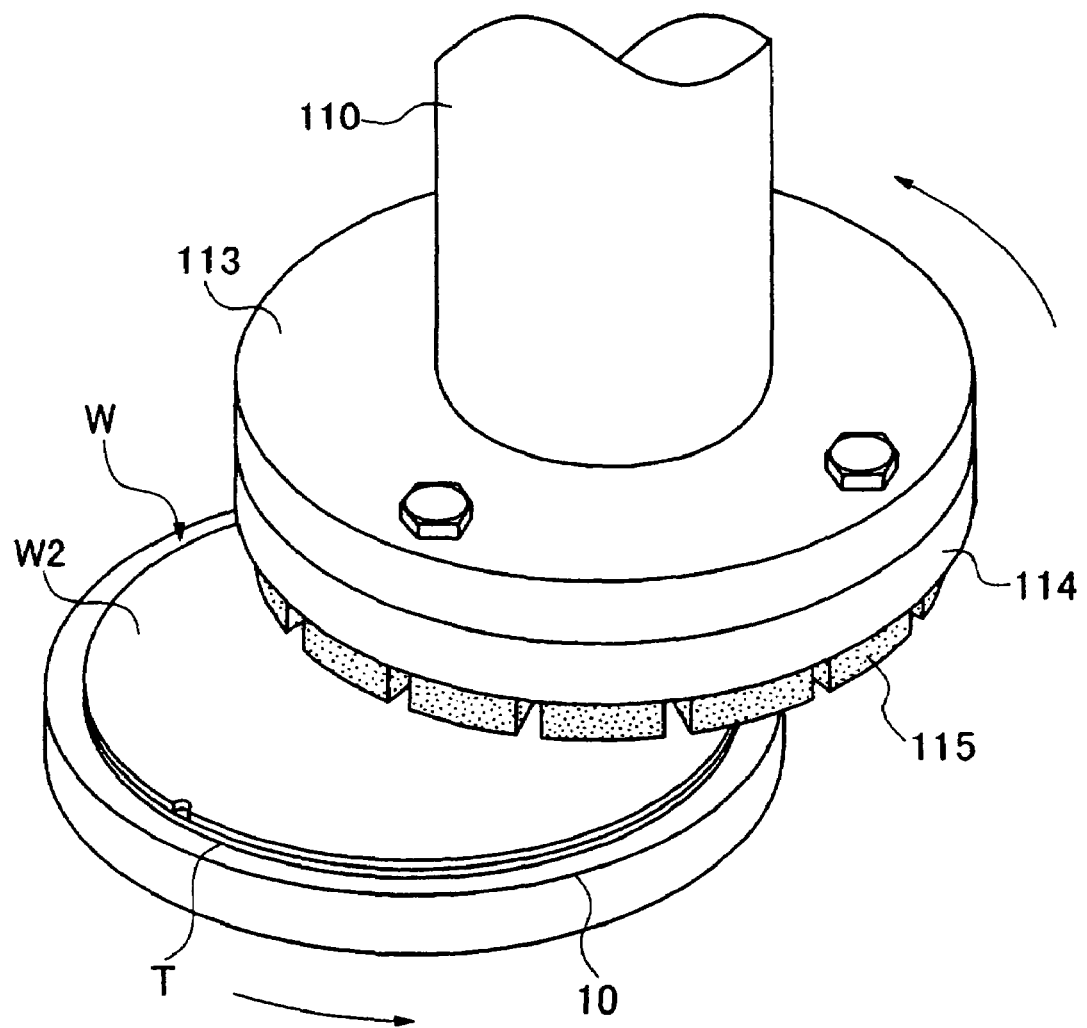
FIG. 3 is a perspective view showing a condition of grinding the back side of the wafer.

As shown in FIG. 3, in the condition where the wafer W is held on the chuck table 10, the chuck table 10 is rotated to thereby rotate the wafer W. At the same time, the spindle 110 is rotated to thereby rotate the grinding wheel 114. Further, the grinding means 11 is lowered by the feeding means 12 shown in FIG. 2 until the grinding stone 115 under rotation comes into contact with the back side W2 of the wafer W under rotation, thereby grinding the back side W2 of the wafer W (back side grinding step). When a desired thickness of the wafer W is obtained by this grinding, the wafer W with the protective tape T is removed from the chuck table 10. Thereafter, the wafer W with the protective tape T is transferred to a laser processing unit 2 shown in FIG. 4. In the laser processing unit 2, the wafer W after ground is held on a chuck table 20 of the laser processing unit 2 in the condition where the back side W2 of the wafer W is exposed.

Figure 4:
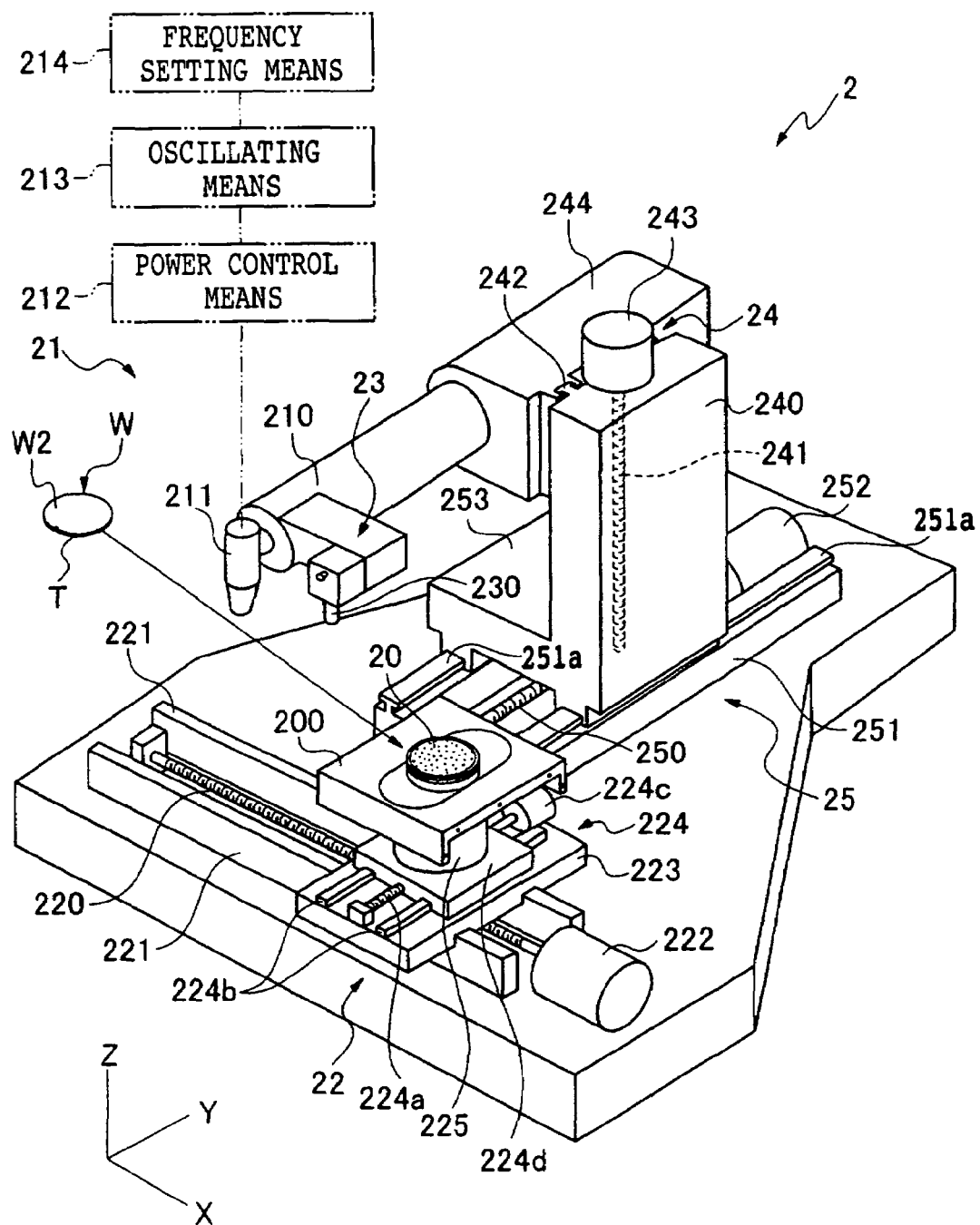
FIG. 4 is a perspective view of a laser processing unit usable in the present invention.

The laser processing unit 2 shown in FIG. 4 includes the chuck table 20 for holding the wafer W and laser beam applying means 21 for applying a laser beam to the wafer W held on the chuck table 20 to process the wafer W. The chuck table 20 is supported to a supporting plate 200 so as to be rotatable and movable in the Y direction. The chuck table 20 is fed in the X direction by work feeding means 22. The work feeding means 22 functions to feed the chuck table 20 in the X direction, thereby moving it relative to the laser beam supplying means 21. The work feeding means 22 includes a ball screw 220 extending in the X direction, a pair of guide rails 221 extending parallel to the ball screw 220, a motor 222 connected to one end of the ball screw 220, a moving plate 223 having an internal nut for threadedly engaging the ball screw 220 and a lower portion for slidably engaging the guide rails 221, position adjusting means 224 provided on the upper side of the moving plate 223, and rotating means 225 movable in the Y direction by the position adjusting means 224 for rotating the chuck table 20. When the ball screw 220 is rotated by the motor 222, all of the moving plate 223, the position adjusting means 224, and the rotating means 225 are moved together in the X direction as being guided by the guide rails 221.

The position adjusting means 224 includes a ball screw 224a extending in the Y direction on the upper side of the moving plate 223, a pair of guide rails 224b extending parallel to the ball screw 224a, a pulse motor 224c connected to one end of the ball screw 224a, and a moving plate 224d having an internal nut for threadedly engaging the ball screw 224a and a lower portion for slidably engaging the guide rails 224b. When the ball screw 224a is rotated by the pulse motor 224c, all of the moving plate 224d and the rotating means 225 are moved together in the Y direction as being guided by the guide rails 224b. The chuck table 20 is connected to the rotating means, and it is rotatable a desired angle by a pulse motor (not shown) included in the rotating means 225.

The laser beam applying means 21 includes a housing 210 and a processing head 211 supported to the housing 210. The processing head 211 functions to apply a laser beam in the downward direction. The power of the laser beam to be applied is controlled by power control means 212. The laser beam is oscillated as a pulsed laser beam by oscillating means 213. The oscillating means 213 can oscillate a pulsed laser beam according to a frequency set by frequency setting means 214. Further, alignment means 23 having an infrared camera 230 for imaging the wafer W by using infrared light is fixed to a side portion of the housing 210. The alignment means 23 functions to detect the separation lines of the wafer W.

The laser beam applying means 21 and the alignment means 23 are movable together in the Z direction by Z-direction feeding means 24. The Z-direction feeding means 24 includes a vertically elongated wall 240, a ball screw 241 extending in the Z direction on one side of the vertically elongated wall 240, a pair of guide rails 242 extending parallel to the ball screw 241, a pulse motor 243 connected to one end of the ball screw 241, and a supporting portion 244 having an internal nut for threadedly engaging the ball screw 241 and a side portion for slidably engaging the guide rails 242. The supporting portion 244 supports the housing 210 of the laser beam applying means 21. When the ball screw 241 is rotated by the pulse motor 243, the supporting portion 244 is moved in the Z direction as being guided by the guide rails 242, so that the laser beam applying means 21 supported to the supporting portion 244 is also moved in the Z direction.

The Z-direction feeding means 24 and the laser beam applying means 21 are movable in the Y direction by Y-direction feeding means 25. The Y-direction feeding means 25 functions to feed the laser beam applying means 21 in the Y direction, thereby moving it relative to the chuck table 20 in an index manner. The Y-direction feeding means 25 includes a fixed base 251 elongated in the Y direction, a ball screw 250 extending in the Y direction on the upper side of the fixed base 251, a pair of guide rails 251a extending parallel to the ball screw 250, a pulse motor 252 connected to one end of the ball screw 250, and a moving base 253 having an internal nut for threadedly engaging the ball screw 250 and a lower portion for slidably engaging the guide rails 251a. The moving base 253 is integral with the vertically elongated wall 240 of the Z-direction feeding means 24. When the ball screw 250 is rotated by the pulse motor 252, all of the moving base 253 and the vertically elongated wall 240 are moved together in the Y direction as being guided by the guide rails 251a, so that the Z-direction feeding means 24 and the laser beam applying means 21 are moved together in the Y direction.

Figure 5:
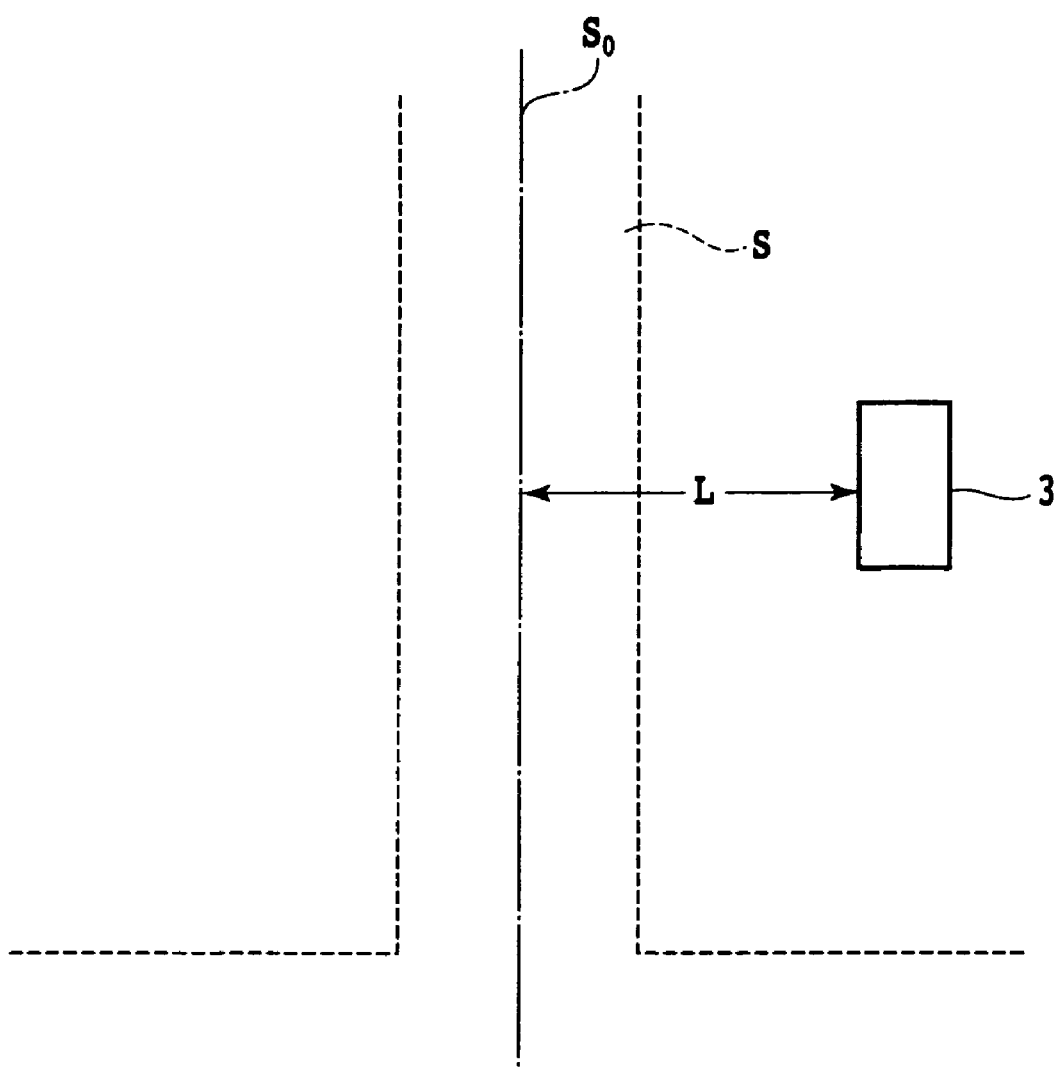
FIG. 5 is a schematic plan view for illustrating a positional relation between a separation line and a marking region.

The wafer W is held on the chuck table 20 in the condition where the protective tape T is placed on the under side of the wafer W and the back side W2 of the wafer W is exposed. The wafer W is imaged by infrared light from the back side W2 in the condition where the wafer W is placed directly under the infrared camera 230 by moving the chuck table 20 in the X direction. For example, in the case of applying a laser beam to a marking region 3 spaced a given distance L from a center line S0 in a separation line S formed on the surface of the wafer W as shown in FIG. 5, an image of the wafer surface obtained by the infrared camera 230 and an image of the wafer surface preliminarily stored in the alignment means 23 are subjected to pattern matching to thereby detect the separation line S. Thereafter, the processing head 211 is moved to the position spaced by the distance L from the center line S0 in the Y direction.

Figure 6:
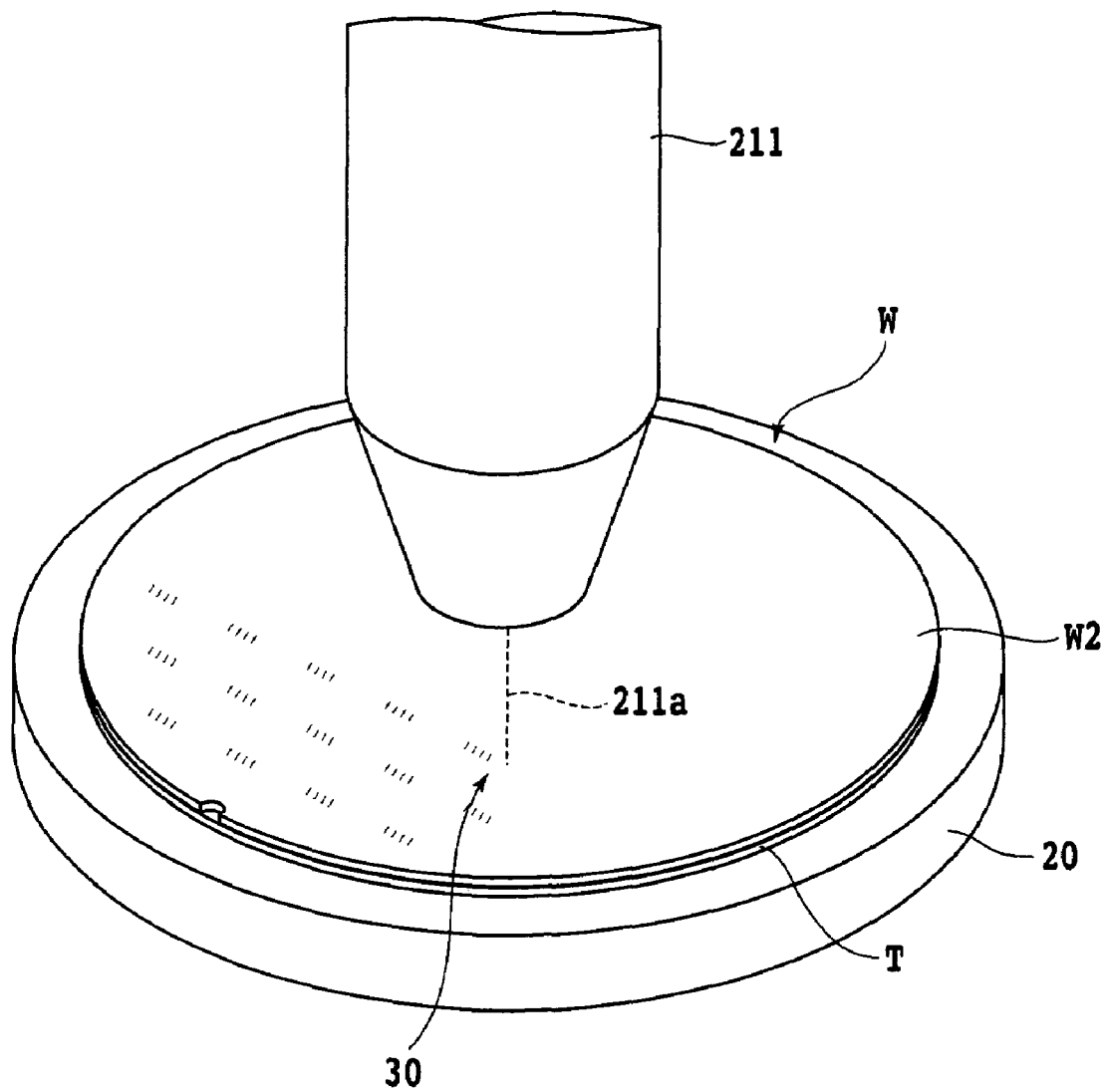
FIG. 6 is a perspective view showing a condition of marking product information on the back side of the wafer.

In the condition where the processing head 211 is set at this position, the chuck table 20 is moved in the X direction and the Y direction, and a laser beam 211a is applied from the processing head 211 to the back side W2 of the wafer W as shown in FIG. 6, thereby marking product information 30 such as characters and marks (marking step). At this time, the chuck table 20 is moved in the X direction by the work feeding means 22 and also moved in the Y direction by the position adjusting means 224, thereby marking the product information 30. The laser beam to be applied from the processing head 211 may be provided by using third harmonic generation (THG) of YAG laser having a wavelength of 355 nm with an average power of 5 W, a repetition frequency of 20 kHz, and a spot size of 100 μm.

After marking the product information 30 on one device, the laser beam applying means 21 or the chuck table 20 is moved in the Y direction by the distance between the adjacent separation lines extending in the X direction, and the marking of the product information 30 is successively performed on each device. After ending the marking of the product information 30 on the devices arranged in one line, the chuck table 20 is moved in the X direction by the distance between the adjacent separation lines extending in the Y direction, and the marking of the product information 30 is similarly performed.

Thus, the product information 30 is marked on all of the devices arranged in the X direction and the Y direction.

In this manner, the product information 30 is marked on all of the devices D before they are separated, i.e., in the form of the wafer W. Because the devices D are arranged at regular intervals in the X and Y directions, the marking of the product information 30 on the devices D can be performed efficiently to improve the productivity as compared with the case that the marking is performed after separating the devices D from each other. After marking the product information 30 on the back side of all the devices D, a laser beam is applied to the separation lines S of the wafer W by using the laser processing unit 2 shown in FIG. 4, thereby forming slits along the separation lines S to separate the devices D from each other.

As in the marking step mentioned above, the detection of the separation lines S is performed by pattern matching between the image obtained by the infrared camera 230 from the back side W2 of the wafer W and the image stored by the alignment means 23. In the condition where the Y coordinate of any detected one of the separation lines S and the Y coordinate of the processing head 211 coincide with each other, the chuck table 20 is moved in the X direction and the laser beam is applied from the processing head 211 to the detected separation line S, thereby forming a slit along this separation line S. Thereafter, the Y-direction feeding means 25 is driven to move the processing head 211 in the Y direction by the distance between the adjacent separation lines S extending in the X direction, and the laser beam is applied to the next separation line S as moving the chuck table 20 in the X direction, thus forming the slits along all of the separation lines S extending in the X direction. Thereafter, the chuck table 20 is rotated 90° and the laser beam is applied similarly to thereby form the slits along all of the separation lines S extending in the Y direction. As a result, all of the devices D are separated from each other (separation step). Thus, the separate devices D each having the product information 30 marked on the back side can be obtained.

This separation step may be performed by using any separating means other than the laser processing unit 2 shown in FIG. 4, such as a cutting device. However, by using the laser processing unit 2, the transfer of the wafer W after the marking step is not necessary and the productivity can therefore be improved. In this preferred embodiment, the marking step is performed immediately after ending the back side grinding step. As a modification, a mirror finishing step for removing a strain layer from the back side of the wafer to finish the back side of the wafer into a mirror surface may be interposed between the back side grinding step and the marking step. For example, the mirror finishing step is performed by CMP (chemical mechanical polishing) or dry polishing.

In the condition where the mirror finishing step is completed after the back side grinding step, the strain layer has been removed from the back side of the wafer, so that there is a possibility that a gettering effect of copper ions or the like inside the wafer may be reduced to cause a deterioration in quality of each device. Especially in the case that the thickness of the wafer is greatly reduced to 100 µm or less or 50 µm or less in the back side grinding step, there is a possibility that the gettering effect may be lost. However, according to the present invention, the marking step is performed after the mirror finishing step to thereby increase the gettering effect, so that the quality of each device can be improved. Further, when the product information is marked on the back side of each device as a mirror surface obtained by the mirror finishing step, the contrast between the mirror surface and the product information can be improved. Accordingly, the product information can be seen more easily as compared with the case that the mirror finishing step is not performed.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A product information marking method comprising:
   a back side grinding step for grinding a back side of a wafer having a plurality of devices formed on a front side so as to be partitioned by a plurality of separation lines, thereby obtaining a desired thickness of said wafer; and
   a marking step for marking product information on the back side of each device by applying a laser beam to the back side of said wafer,
   wherein the back side of said wafer is ground by a grinding stone containing abrasive grains having a grain size of 1 µm or less in said back side grinding step.

2. A product information marking method comprising:
   a back side grinding step for grinding a back side of a wafer having a plurality of devices formed on a front side so as to be partitioned by a plurality of separation lines, thereby obtaining a desired thickness of said wafer;
   a marking step for marking product information on the back side of each device by applying a laser beam to the back side of said wafer; and
   a mirror finishing step to be performed before said marking step, wherein a strain layer is removed from the back side of said wafer by chemical mechanical polishing or dry polishing to thereby obtain a mirror surface on the back side of said wafer.

* * * * *